United States Patent [19]
Romero et al.

[11] Patent Number: 5,565,705
[45] Date of Patent: Oct. 15, 1996

[54] ELECTRONIC MODULE FOR REMOVING HEAT FROM A SEMICONDUCTOR DIE

[75] Inventors: Guillermo L. Romero; Joe L. Martinez, Jr., both of Phoenix, Ariz.

[73] Assignee: Motorola, Inc., Schaumburg, Ill.

[21] Appl. No.: 235,992

[22] Filed: May 2, 1994

[51] Int. Cl.$^6$ ...................................................... H01L 23/34
[52] U.S. Cl. ............................ 257/718; 257/723; 257/725
[58] Field of Search ..................................... 257/723, 718, 257/725, 719, 720, 712

[56] References Cited

U.S. PATENT DOCUMENTS

| | | | |
|---|---|---|---|
| 4,727,454 | 2/1988 | Neidig et al. | 361/382 |
| 4,774,632 | 9/1988 | Neugebauer | 257/718 |
| 4,990,462 | 2/1991 | Sliwa, Jr. | 437/51 |
| 5,001,548 | 3/1991 | Iversen | 357/82 |
| 5,020,583 | 6/1991 | Aghajanian et al. | 164/97 |
| 5,126,829 | 6/1992 | Daikoku et al. | 357/82 |
| 5,216,279 | 6/1993 | Nakao | 257/712 |
| 5,221,558 | 6/1993 | Sonuparlak et al. | 427/376.1 |
| 5,222,542 | 6/1993 | Burke | 164/97 |
| 5,386,341 | 1/1995 | Olson et al. | 361/707 |

OTHER PUBLICATIONS

Document No. 07972347 Name Anderson et al. Filing Date Nov. 6, 1992.
Document No. 08176598 Name Romero et al. Filing Date Jan. 3, 1994.
Document No. 08190974 Name Romero et al. Filing Date Feb. 3, 1994.
Document No. 08130824 Name Romero Filing Date Oct. 4, 1993.
"Metal–Matrix Composites for Electronic Packaging," by Carl Zweben JOM, vol. 44, Iss 7, pp. 15–23, Jul. 1992.

*Primary Examiner*—William Mintel
*Assistant Examiner*—Roy Potter
*Attorney, Agent, or Firm*—Rennie William Dover

[57] ABSTRACT

An electronic module (10) for removing heat from a semiconductor die (41) and a method of making the electronic module (10). The electronic module (10) has a baseplate (11) mated with an isolation structure (23). The isolation structure (23) has three portions: a first portion is bonded to the top surface (12) of the baseplate (11), a second portion is bonded to the bottom surface (13) of the baseplate (11), and a third portion is bonded to a side (14) of the baseplate (11). A semiconductor die (41) is bonded to the first portion of the isolation structure (23) and another semiconductor die (41) is bonded to the second portion of the isolation structure (23). The baseplate (11) has a cavity (20) through which a fluid flows and transports heat away from each semiconductor die (41).

15 Claims, 7 Drawing Sheets

ELECTRONIC MODULE FOR REMOVING HEAT FROM A SEMICONDUCTOR DIE

The present application is related to copending U.S. patent application Ser. No. 07/972,347, Attorney's Docket No. SC08062T, entitled "METHOD FOR FORMING A POWER CIRCUIT PACKAGE," filed on Nov. 6, 1992, by Samuel J. Anderson et al. and assigned to the same assignee, Motorola, Inc.

The present application is further related to copending U.S. patent application Ser. No. 08/176,598, Attorney's Docket No. SC08507T, entitled "POWER DISSIPATION APPARATUS AND METHOD FOR MAKING", filed Jan. 3, 1994, by Guillermo Lo Romero et al. and assigned to the same assignee, Motorola, Inc.

The present application is further related to copending U.S. patent application Ser. No. 08/190,974, Attorney's Docket No. SC08508T, entitled "ELECTRONIC DEVICE ASSEMBLY AND METHOD FOR MAKING", filed Feb. 3, 1994, by Guillermo L. Romero et al. and assigned to the same assignee, Motorola, Inc.

The present application is further related to copending U.S. patent application Ser. No. 08/130,824, Attorney's Docket No. SC08650T, entitled "SEMICONDUCTOR PACKAGE AND MODULE AND METHOD FOR FABRICATING", filed Oct. 4, 1993, by Guillermo L. Romero et al. and assigned to the same assignee, Motorola, Inc.

FIELD OF THE INVENTION

The present invention relates, in general, to electronic modules, and more particularly, to electronic modules for removing heat from a semiconductor die.

BACKGROUND OF THE INVENTION

An important design consideration for systems level designers in such areas as industrial power products, automotive power products, electric vehicles, power supplies, etc. is the removal of heat dissipated by the systems' electronic components. Generally, these components consume large amounts of power and generate large amounts of heat. Therefore, they are commonly referred to as power devices. If the heat generated by these devices is not removed, their junction temperatures will exceed a critical level, resulting in damage or destruction of the electronic components, the system, or both. A commonly used approach for removing heat from electronic components is to attach a heat sink to them, which facilitates heat transfer away from the electronic components. Heat sinks may be either air cooled or liquid cooled, wherein heat is transferred, via conduction, from the electronic components to a surface in contact with the air or liquid. Subsequently, the air or liquid carries the heat away from the electronic components by means of convection.

Another important design consideration is the size of the electrical system. Generally, it is desirable for electrical systems to be small and light-weight because of space and weight limitations. However, electrical systems comprising power devices are typically constrained by the ability of the electrical system to dissipate heat generated by the power devices. More particularly, power devices require large heat sinks to ensure sufficient removal of heat to maintain power device junction temperatures within a safe operating range. Thus, electrical systems having power devices often include large, heavy, structures for removing heat, i.e., large heat sinks. These large heat sinks increase the size and weight of the electrical systems.

Accordingly, it would be advantageous to have an electronic module for removing heat from semiconductor die. It would be of further advantage for the electronic module to be capable of reducing electrical system size, while maintaining junction temperatures within their safe operating range.

DETAILED DESCRIPTION OF THE DRAWINGS

Generally, the present invention provides an electronic module or power dissipation apparatus for removing heat from integrated devices and a method for making or fabricating the electronic module. The electronic module includes a base structure having a top mounting surface separated from a bottom mounting surface by a cavity. It should be noted that the top mounting surface is also referred to as a top and the bottom mounting surface is also referred to as a bottom. Preferably, the top is coupled to the bottom by heat fins which increase a surface area of the electronic module and facilitate heat removal from the semiconductor die. More particularly, the heat is removed from junctions of integrated devices fabricated in the semiconductor die. In addition, the base structure has inlet and outlet ports for allowing a fluid to flow through the base structure and remove heat from the semiconductor die.

The base structure is formed by mating two or more porous preforms and impregnating the mated porous preforms with a molten conductive material, thereby forming a unitary structure. An isolation structure is mounted to the electronic module, wherein one portion of the isolation structure is adjacent the top and another portion of the isolation structure is adjacent the bottom. One or more semiconductor die are mounted to the isolation structure adjacent the top and one or more semiconductor die are mounted to the portion of the isolation structure adjacent the bottom. Fluid flowing through the cavity carries the heat dissipated by the integrated devices away from the electronic module.

Figure 1:
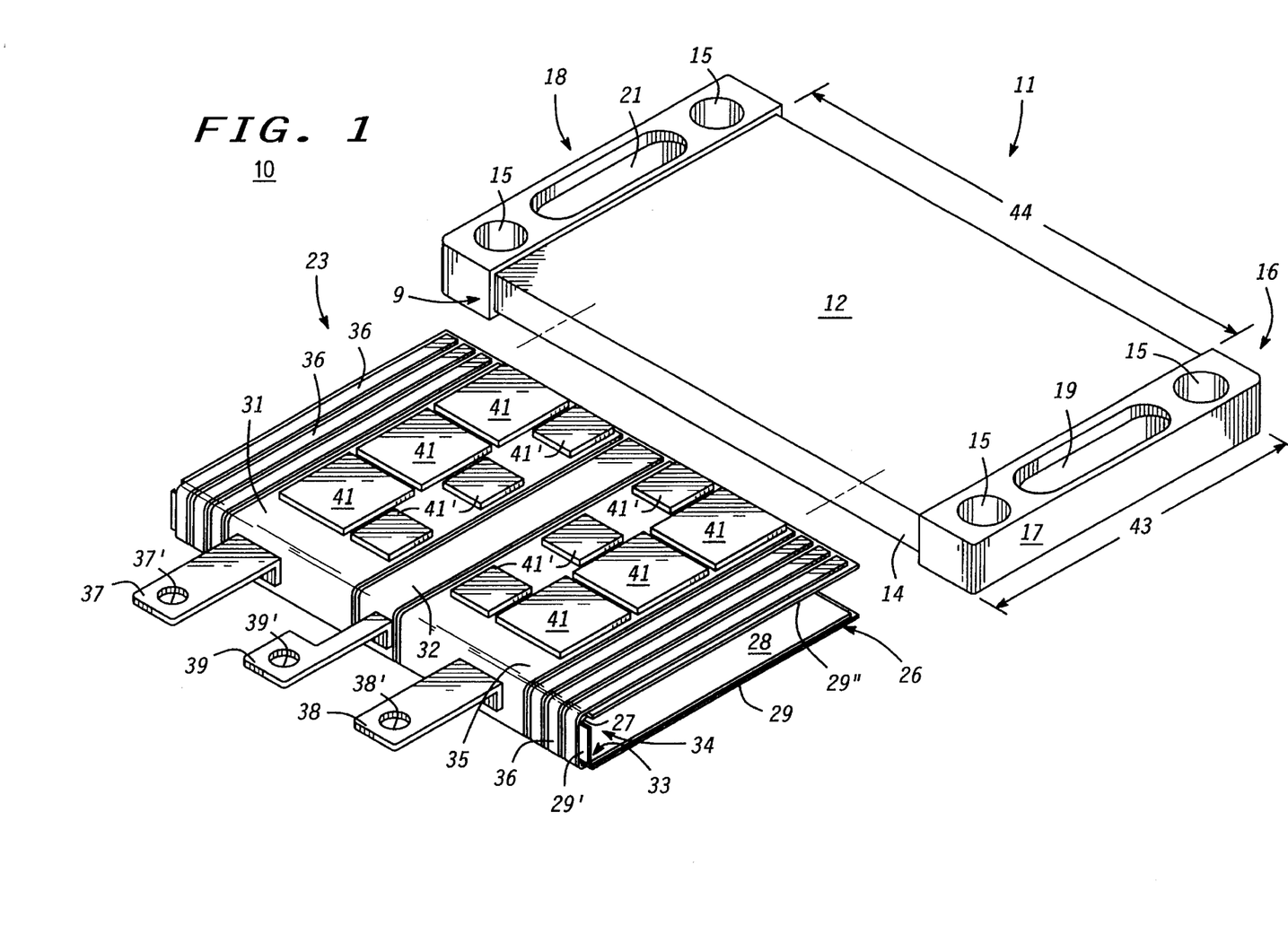
FIG. 1 illustrates an exploded isometric view of an electric module in accordance with a first electronic module embodiment of the present invention.

FIG. 1 illustrates an exploded isometric view of an electronic module 10 in accordance with a first electronic module embodiment of the present invention. Preferably, electronic module 10 includes a rectangularly shaped unitary base structure 11 having a top surface 12, a bottom surface 13, opposing sides 14 and 16, and opposing sides 17 and 18. By way of example and still referring to FIG. 1, unitary base structure 11 has a width indicated by arrows 43 and a mating length indicated by arrows 44. Briefly referring to FIG. 2 unitary base structure 11 has a mating thickness indicated by arrows 45. Top surface 12 and bottom surface 13 are spaced apart by a cavity 20; further, top surface 12 is coupled to bottom surface 13 by internal heat fins 25. Internal heat fins 25 serve to increase the surface area of baseplate 11 in contact with a cooling fluid. It should be noted that length 44 and thickness 45 have been referred to as mating length 44 and mating thickness 45 because they represent the dimensions of the portions of baseplate 11 that mate with an isolation structure 23.

Referring again to FIG. 1, unitary base structure 11 has an inlet port 19 and mounting holes 15 adjacent side 17 and an outlet port 21 and mounting holes 15 adjacent side 18. Although ports 19 and 21 have been labeled as inlet and outlet ports, respectively, it should be understood that, typically, unitary base structure 11 is a symmetric structure, thus the inlet and outlet ports may be reversed. The cooling fluid flows into inlet port 19 and out of outlet port 21, transporting heat away from baseplate 11 and any semiconductor die mounted to unitary base structure 11. In addition, unitary base structure 11 includes alignment notches 9, to facilitate mating an isolation structure 23 and unitary base structure 11. Unitary base structure 11 is also referred to as a baseplate or heat sink.

In one embodiment, baseplate 11 is formed from silicon carbide preforms, wherein porous base and lid preforms (not shown) are formed from a slurry and molded into desired shapes using conventional injection molding technology. The slurry may comprise a mixture of a powdered semiconductor material such as silicon carbide and a binding agent such as a polymer based xylene. Subsequently, the binding agent is burned away in an oven, leaving porous base and lid preform structures. The porous base preform is mated with the porous lid preform and placed in a bath of molten aluminum at atmospheric pressure. The molten aluminum infiltrates the mated preforms. Although the porous base and porous lid are individual preform components prior to infiltration, the molten aluminum flows continuously within both preforms through capillary flow and unites the two parts into a unitary, sealed, reinforced baseplate with a hollow inside having fins. In addition to forming a unitary baseplate 11, the molten aluminum serves to strengthen baseplate 11. Methods of forming silicon carbide preform structures are described in copending U.S. patent application Ser. No. Ser. No. 07/972,347, entitled "METHOD FOR FORMING A POWER CIRCUIT PACKAGE," filed on Nov. 6, 1992, by Samuel J. Anderson et al. and assigned to the same assignee, Motorola, Inc., and which is hereby incorporated herein by reference.

FIG. 1 further illustrates a U-shaped support structure 23 having legs 24 and 26 and a conductive strap 27. U-shaped support structure 23 may be formed by bonding a first layer of conductive material 28 to one side of three sheets of dielectric material 29, 29', and 29", and bonding a second layer of conductive material to a side opposite the one side of the three sheets of dielectric material 29, 29', and 29". Preferably, the three sheets of dielectric material 29, 29', and 29" are spaced apart from each other. Although not shown, it should be noted that at this stage in the formation of electronic module 10 sheets of dielectric material 29, 29', and 29" are coplanar. Since the second layer of conductive material is divided into conductive strips in a subsequent processing step, a reference numeral has not been attached to this layer. Techniques for bonding copper to a ceramic substrate are well known to those skilled in the art and may include, for example, a direct bonded copper technique.

The second layer of conductive material is patterned to form strips of conductive material which are electrically isolated from each other. Suitable materials for the second layer of conductive material include copper, alloys of copper, aluminum, alloys of aluminum, and the like. In accordance with the present invention, the second layer of conductive material is copper which is patterned to form die support conductive strips 31 and 35, a common conductive strip 32, and interconnect conductive strips 36, wherein the conductive strips are electrically isolated from each other. Methods for patterning layers of conductive material are well known to those skilled in the art.

By way of example, portions of first layer of conductive material 28 and the patterned second layer of conductive material between layers of dielectric material 29 and 29' are bent or folded to form a bend 33 having an angle of approximately 90 degrees. In addition, portions of first layer of conductive material 28 and the patterned second layer of conductive material between layers of dielectric material 29' and 29" are bent or folded to form a bend 34 having an angle of approximately 90 degrees. Thus, first layer of conductive material 28 and the patterned second layer of conductive material are bent to form the U-shaped support structure 23 having two parallel legs 24 and 26.

Thus, leg 24 is coupled to leg 26 by a conductive strap 27, wherein legs 24 and 26 are perpendicular to conductive strap 27. Preferably, the length of legs 24 and 26 is approximately equal to the width 43 of baseplate 11, and the width of conductive strap 27 is at least equal to the thickness 45 (shown in FIG. 2) of baseplate 11. It should be understood that the dimensions of U-shaped support structure 23 are not a limitation of the present invention and that the length of legs 24 and 26 can be greater than or less than width 43 of baseplate 11.

By way of example, first layer of conductive material 28 and the second layer of conductive material are copper having a thickness ranging between approximately 200 micrometers (μm) and 300 μm. Further, layers of dielectric material 29, 29' and 29" are ceramic each having a thickness ranging between approximately 380 μm and approximately 635 μm. Preferably, layers of dielectric material 29 and 29' have a width approximately equal to the width of baseplate 11, and layer of dielectric material 29" has a width approximately equal to the thickness of baseplate 11. It should be understood that,the thickness of the layers of dielectric material are selected in accordance with desired dielectric strength of the dielectric material and the dimensions of the conductive material are selected in accordance with the desired current carrying capability of the conductive material.

Alternatively, portions of first layer of conductive material 28 where bends 33 and 34 are formed may be removed to prevent an electrical short between first layer of conductive material 28 and the second layer of conductive material when they are bent.

Using techniques well known to those skilled in the art, semiconductor die 41 and 41' are mounted to die-support conductive strips 31 and 35. It should be understood that the number, the type, and the positioning of semiconductor die 41 and 41' on conductive strips 31 and 35 are not limitations of the present invention. Portions of semiconductor die 41 and 41' are coupled to common conductive strip 31 by electrical interconnects 42. Likewise, portions of semiconductor die 41 and 41' adjacent leg 24 are coupled to portions of semiconductor die 41 and 41' adjacent leg 26 by bonding electrical interconnects 43 to the desired interconnect conductive strips 36. Further, a lead 37 is bonded to die support conductive strip 31, a lead 38 is bonded die support conductive strip 35, and a lead 39 is bonded to common conductive strip 32. Techniques for bonding leads to conductive strips, i.e., conductive strips 31, 35, and 32 are well known to those skilled in the art. Leads 37, 38, and 39 have mounting holes 37', 38', and 39' for coupling electronic module 10 to motors, power supplies, buss bars, etc. It should be noted that the motors, power supplies, buss bars, etc. are not shown in the figures.

U-shaped support structure 23 is mated with baseplate 11, wherein baseplate 11 is positioned between legs 24 and 26 and bonded to U-shaped support structure 23 by, for example, soldering or brazing techniques. When mated, U-shaped support structure 23 wraps around baseplate 11 such that conductive strap 27 is adjacent side 14, leg 24 is adjacent top surface 12, and leg 26 is adjacent bottom surface 13. In other words, legs 24 and 26 straddle baseplate 11. Thus, a first portion of conductive layer 28, a second portion of conductive layer 28, and conductive strap 27 form a unitary structure, wherein the first portion of conductive layer 28 contacts top surface 12 and the second portion of conductive layer 28 contacts bottom surface 13.

Figure 2:
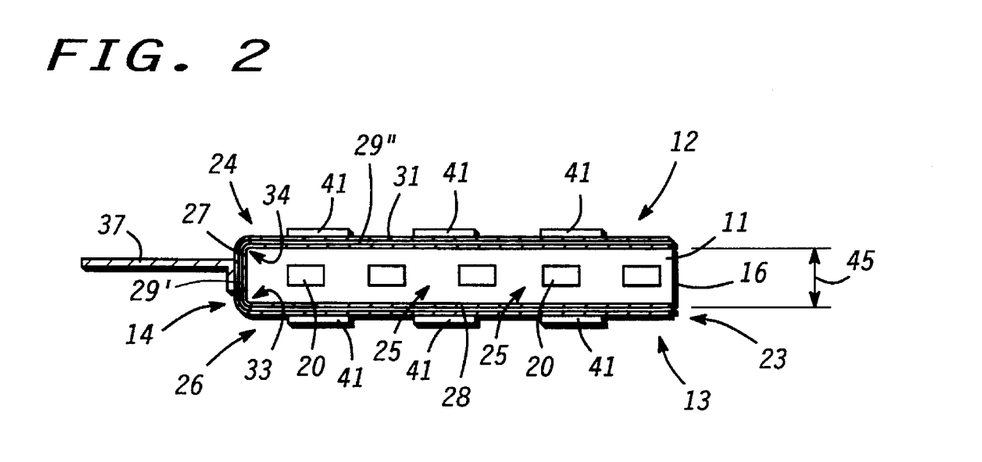
FIG. 2 illustrates a cross-sectional view of the electronic module of FIG. 1.
Figure 3:
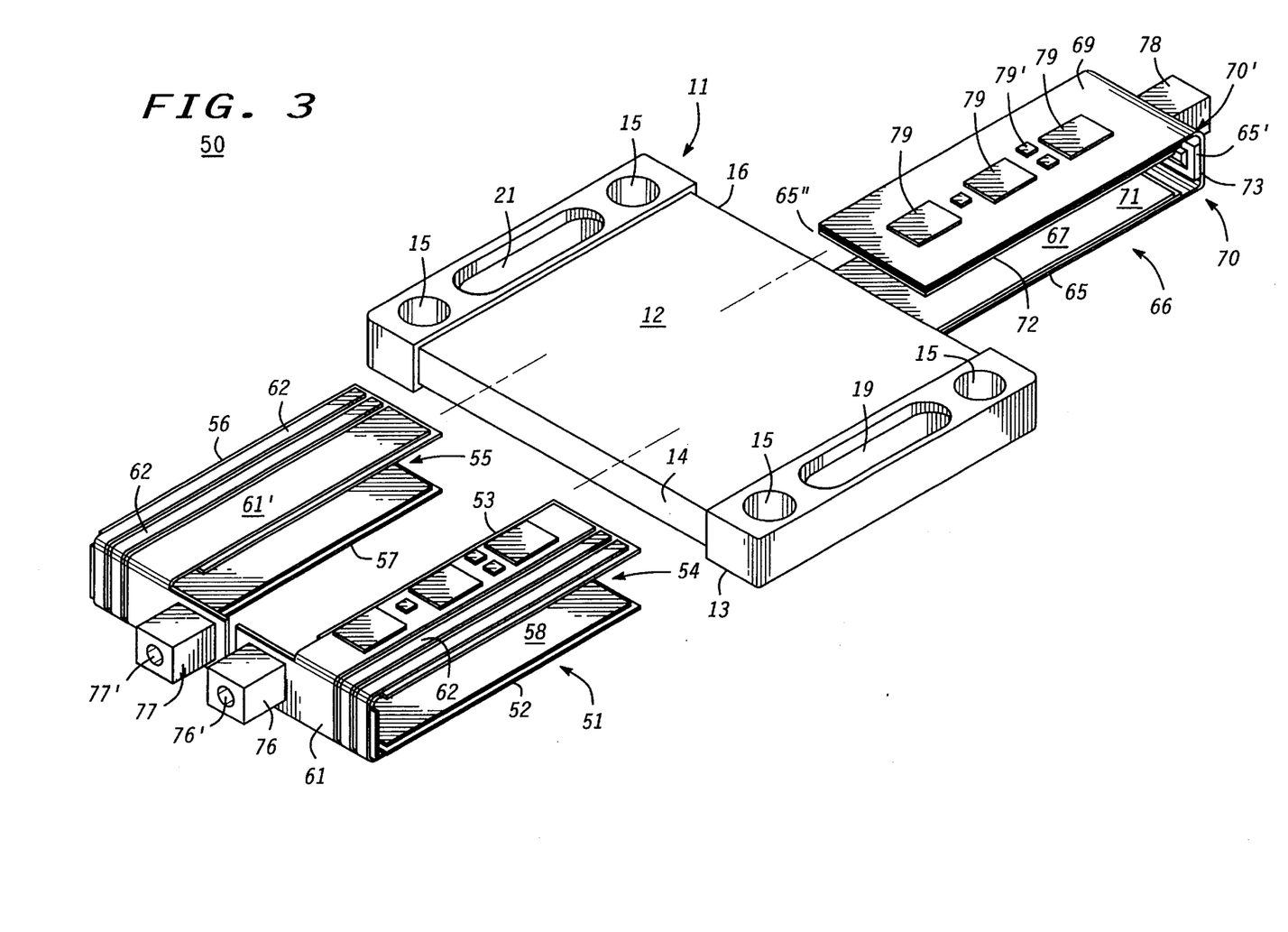
FIG. 3 illustrates an exploded isometric view of an electronic module in accordance with a second electronic module embodiment of the present invention.

Although not shown in FIGS. 1–3, it should be understood that a retaining wall (shown in FIG. 7) for containing an encapsulating material is mounted to baseplate 11 and a portion of baseplate 11 is encapsulated in a mold compound. The mold compound protects the semiconductor die from being damaged by mechanical stresses. It should be noted that ports 19 and 21, mounting holes 15 and portions of leads 37, 38, and 39 are not encapsulated within the mold compound. Methods of encapsulating semiconductor die within a mold compound are well known to those skilled in the art.

FIG. 2 shows a cross-sectional view of electronic module 10 of FIG. 1 and further illustrates having semiconductor die 41 adjacent top 12 and bottom 13 of baseplate 11. It should be understood that the same reference numerals are used in the figures to denote the same elements. What is shown in FIG. 2 is baseplate 11 having top 12 separated from bottom 13 by cavity 20. In addition, internal heat fins 25 are shown, wherein heat fins 25 are pin fins. It should be understood that the type of internal heat fins is not a limitation of the present invention, and that heat fins 25 may have other configurations that increase the surface area of baseplate 11 within cavity 20.

Layer of conductive material 28 is bent into a U-shape such that conductive layer 28 wraps around baseplate 11. A portion of conductive layer 28 is adjacent side 14 and serves as a conductive strap 27, and portions of conductive layer 28 are adjacent top and bottom 12 and 13, respectively. A layer of dielectric material 29 is disposed on the portion of conductive layer 28 adjacent bottom 13, a strip of dielectric material 29' is adjacent conductive strap 27, and a layer of dielectric material 29" is adjacent the portion of conductive layer 28 adjacent top 12. Further, a die-support conductive strip 31 is bent into a U-shape such that U-shape conductive strip 31 wraps around baseplate 110. It should be understood that layer of conductive material 28, dielectric material 29, 29', and 29", and die-support conductive strip 31 cooperate to form isolation structure 23. Lead 37 extends from the portion of isolation structure 23 adjacent side 14.

Semiconductor die 41 are mounted to legs 24 and 26 of isolation structure 23. In other words, a first portion 24 of isolation structure 23 is adjacent top 12 and a second portion 26 of isolation structure 23 is adjacent bottom 13. Semiconductor die 41 are mounted to first portion 24, i.e., one leg of isolation structure 23, and to second portion 26, i.e., the second leg of isolation structure 23. Thus, semiconductor die 41 are mounted on two opposing sides of baseplate 11. An advantage of mounting semiconductor die on two opposing sides of baseplate 11 is that it reduces the size of electronic module 10.

FIG. 3 illustrates an exploded isometric view of an electronic module 50 in accordance with a second electronic module embodiment of the present invention. What is shown in FIG. 3 is a baseplate 11 having an inlet port 19, an outlet port 21, and mounting holes 15. In addition, FIG. 3 illustrates a support structure 51 comprising a first U-shaped portion 54, a second U-shaped portion 55 spaced apart from first U-shaped portion 54, and conductive strips 61 and 61'. First U-shaped portion 54 has a pair of legs 52 and 53 and second U-shaped portion 55 has a pair of legs 56 and 57. Support structure 51 is formed by positioning five sheets of dielectric material in an I-formation and bonding a first layer of conductive material 58 to one side of each of the five sheets of dielectric material (not shown) and bonding a second layer of conductive material to a side opposite the one side of the five sheets of dielectric material. Preferably, U-shaped portions 53 and 54 are spaced apart from each other.

The second layer of conductive material is patterned to form strips of conductive material which are electrically isolated from each other. Suitable materials for the strips of conductive material include copper, alloys of copper, aluminum, alloys of aluminum, and the like. For example, the second layer of conductive material is patterned to form die-support conductive strips 61 and 61' and interconnect conductive strips 62, wherein the conductive strips are electrically isolated from each other. Methods for patterning layers of conductive material are well known to those skilled in the art.

The patterned second layer of conductive material are bent to form U-shaped portions 54 and 55. U-shaped portion 54 includes a leg 52 coupled to a leg 53 by a portion of conductive strip 61. Legs 52 and 53 are parallel to each other and perpendicular to conductive strip 61. Similarly, U-shaped portion 55 includes a leg 56 coupled to a leg 57 by a portion of conductive strip 61'. Legs 56 and 57 are parallel to each other and perpendicular to conductive strip 61' It should be understood that the dimensions of U-shaped portions 54 and 55 are not a limitation of the present invention and that the length of legs 52, 53, 56, and 57 can be greater than or less than width 43 of baseplate 11.

A first portion of baseplate 11 is positioned between legs 52 and 53 of support structure 51 and a second portion of baseplate 11 is positioned between legs 56 and 57 of support structure 51. In other words, the pair of legs 52 and 53 and the pair of legs 56 and 57 straddle baseplate 11. Then, support structure 51 is bonded to baseplate 11 using such techniques as, for example, soldering or brazing. When mated, conductive strips 61 and 61' are adjacent side 14, leg 52 is adjacent one portion of top surface 12, leg 53 is adjacent another portion of top surface 12, leg 56 is adjacent one portion of bottom surface 13, and leg 57 is adjacent another portion of bottom surface 13.

In addition, a U-shaped support structure 66 is formed by bonding a first layer of conductive material 67 to one side of three sheets of dielectric material 65, 65', and 65" and bonding a second layer of conductive material 69 to a side opposite the one side of the three sheets of dielectric material 65, 65', and 65". Preferably, the three sheets of dielectric material 65, 65', and 65" are spaced apart from each other. Techniques for bonding copper to a ceramic substrate are well known to those skilled in the art and include, for example, a direct bonded copper technique.

Portions of layers of conductive material 67 and 69 are bent or folded to form a bend 70 having an angle of approximately 90 degrees. In addition, portions of layers of conductive material 67 and 69 bent or folded to form a bend 70' having an angle of approximately 90 degrees. Thus, layers of conductive material 67 and 69 are bent to form a U-shaped support structure 66 having two parallel legs 71 and 72. Leg 71 is coupled to leg 72 by a conductive strap 73, wherein legs 71 and 72 are perpendicular to conductive strap 73. Preferably, the length of legs 71 and 72 is approximately equal to the width 43 of baseplate 11 (FIG. 1), and the width of conductive strap 73 is approximately equal to the mating thickness 45 of baseplate 11 (FIG. 2). It should be understood that the dimensions of U-shaped support structure 66 are not a limitation of the present invention and that the length of legs 71 and 72 can be greater than or less than width 43 of baseplate 11.

U-shaped support structure 66 is mated with baseplate 11, wherein a portion of baseplate 11 is positioned between legs 71 and 72 and bonded to U-shaped support structure 66. Further, leg 71 is interdigitated with legs 52 and 57, and leg 72 is interdigitated with legs 53 and 56. Conductive strap 73 is adjacent side 17, leg 71 is adjacent a portion of top surface 12, and leg 72 is adjacent a portion of bottom surface 13.

Further, electrodes 76 and 77 are bonded to portions of die conductive straps 61 and 61', respectively, and a electrode 78 is bonded conductive strap 73. Conductors 76 and 77 have interconnect holes 6' and 77', respectively, for electrically interconnecting electronic module 50 to motors, power supplies, buss bars, etc. It should be noted that the motors, power supplies, buss bars, etc. are not shown in the figures. Although not shown, it should be noted that electrode 78 also has an interconnect hole for electrically interconnecting electronic module 50 to other circuitry. Using techniques well known to those skilled in the art, integrated devices 79 and 79' are mounted to conductive strips 61 and 69.

Figure 4:
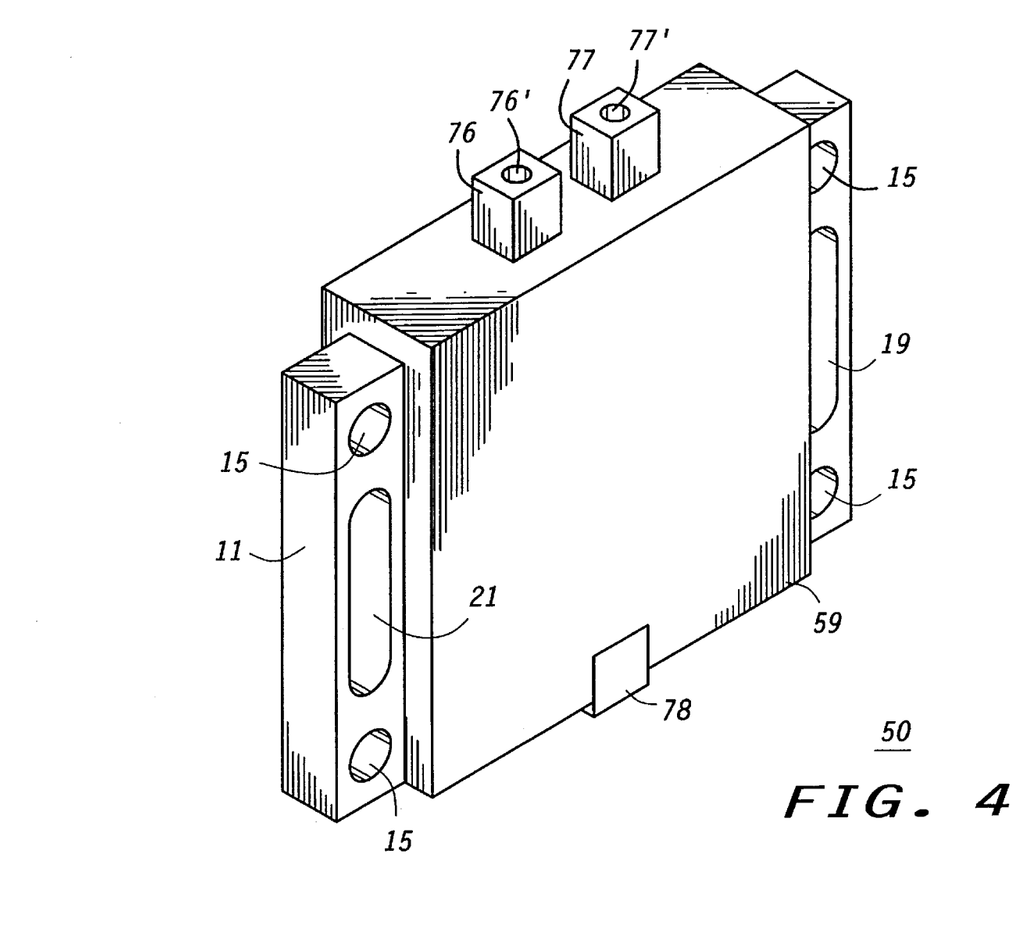
FIG. 4 illustrates an isometric view of the electronic module of FIG. 3 after encapsulation within a mold compound.

FIG. 4 illustrates an isometric view of electronic module 50 encapsulated by an encapsulating material or a mold compound 59. Techniques for encapsulating electronic module 50 and suitable types of mold compounds are well known to those skilled in the art. The mold compound protects the semiconductor die from being damaged by mechanical stresses, environmental contaminants, ionic contaminants, and moisture. Ports 19 and 21, mounting holes 15, and electrodes 76, 77, and 78 are not encapsulated within the mold compound.

Figure 5:
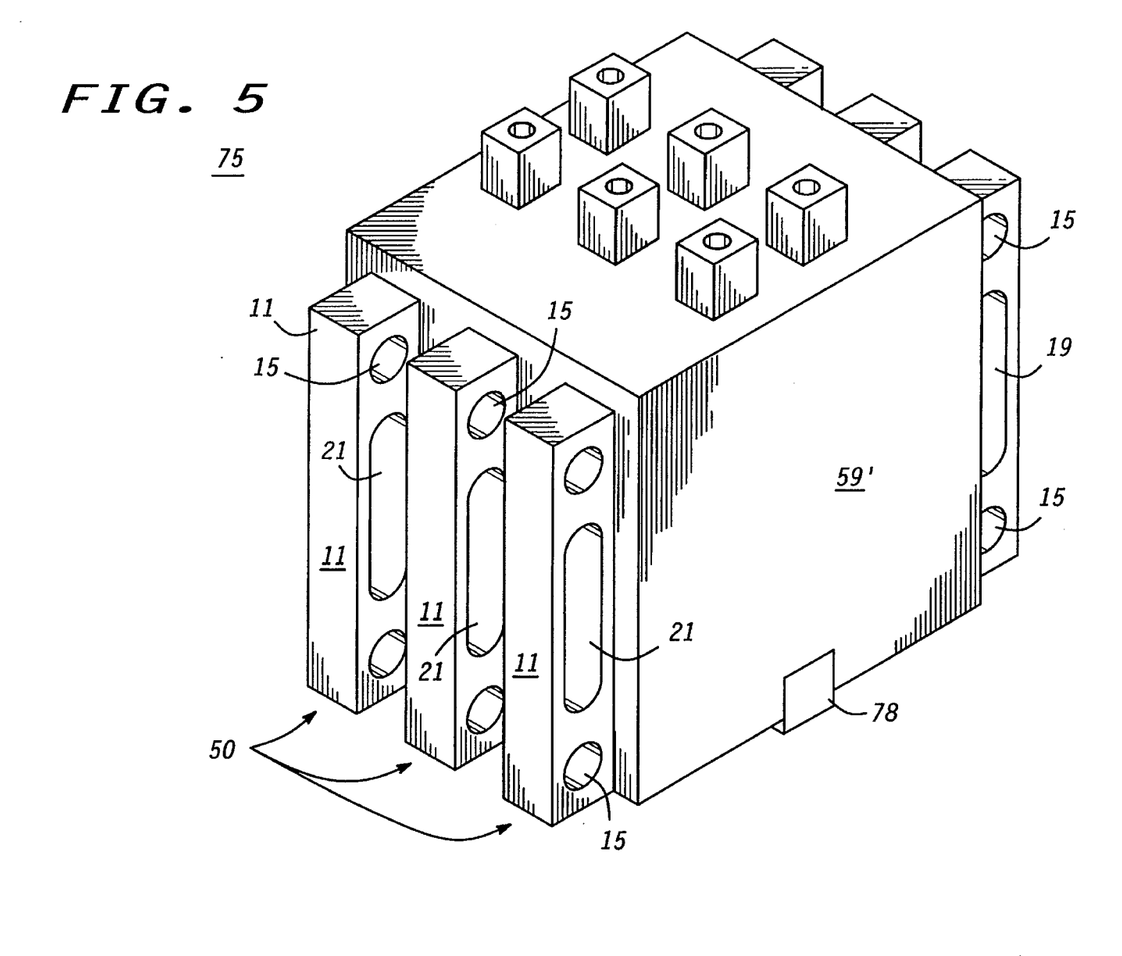
FIG. 5 illustrates an isometric view of three of the electronic modules of FIG. 3 coupled to form a three-phase liquid cooled inverter system.

FIG. 5 illustrates an isometric view of a three-phase liquid cooled inverter module 75. Three-phase liquid cooled inverter module 75 comprises three electronic modules 50 coupled or joined together and encapsulated by an encapsulating material 59. Coupling electronic modules such as electronic modules 50 together further reduces a form factor of the plurality of electronic modules 50, i.e., decreases the area required for the plurality of electronic modules.

Figure 6:
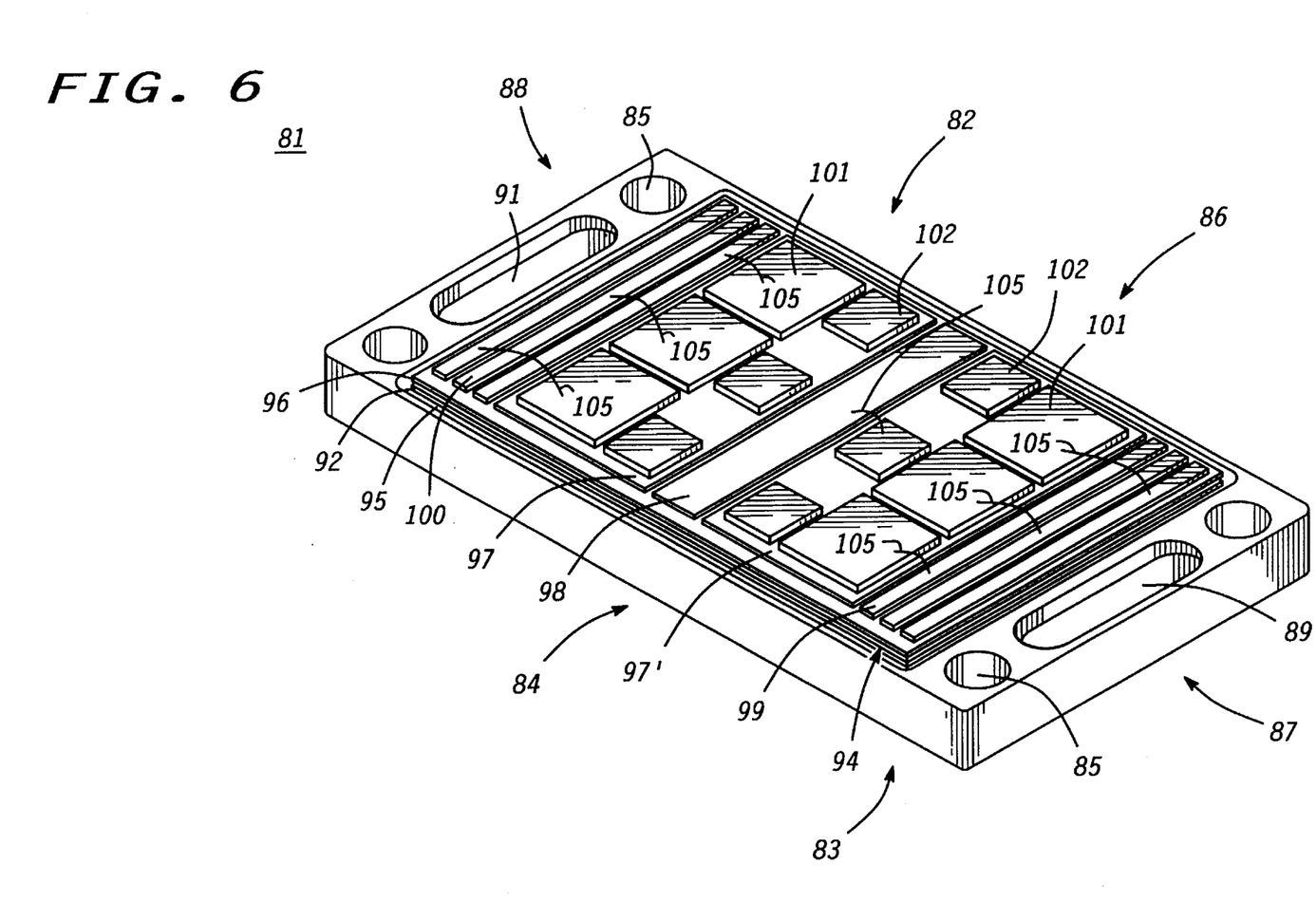
FIG. 6 illustrates an isometric view of a portion of an electronic module in accordance with a third electronic module embodiment of the present invention.

FIG. 6 illustrates an isometric view of a baseplate portion of an electronic module in accordance with a third electronic module embodiment of the present invention. The baseplate portion comprises a rectangularly shaped unitary base structure 81 having a top side 82, a bottom side 83, opposing sides 84 and 86, and opposing sides 87 and 88. Although top side 82 and bottom side 83 are spaced apart by a cavity, they are coupled together by internal heat fins which serve to increase the surface area of baseplate 81 in contact with a cooling fluid (not shown). The cavity 114 and internal heat fins 116 are shown and described in FIG. 8. In addition, unitary base structure 81 has an inlet port 89 and mounting holes 85 adjacent side 87 and an outlet port 91 and mounting holes 85 adjacent side 88. Although ports 89 and 91 have been labeled as inlet and outlet ports, respectively, it should be understood that, typically, unitary base structure 81 is a symmetric structure, thus the inlet and outlet ports may be reversed. The cooling fluid flows into inlet port 89 and out of outlet port 91, transporting heat away from baseplate 81 and any semiconductor die mounted to unitary base structure 81. It should be noted that unitary base structure 81 is also referred to as a baseplate.

Heat sink 81 is formed by mating two porous preforms and impregnating the mated porous preforms with a molten conductive material, thereby forming a unitary structure. The molten aluminum flows continuously within the molded porous preforms via capillary flow, and joins the porous molded preforms into a single, sealed, reinforced baseplate having a cavity and fins similar to those of baseplate 11 shown in FIG. 1. In addition, baseplate 81 has a rectangular shaped groove 95 in top side 82. Groove 95 serves as an alignment groove and will be further described with reference to FIG. 8. It should be understood that a groove 95' is also formed in bottom side 83 and will be shown and described with reference to FIG. 8.

Figure 8:
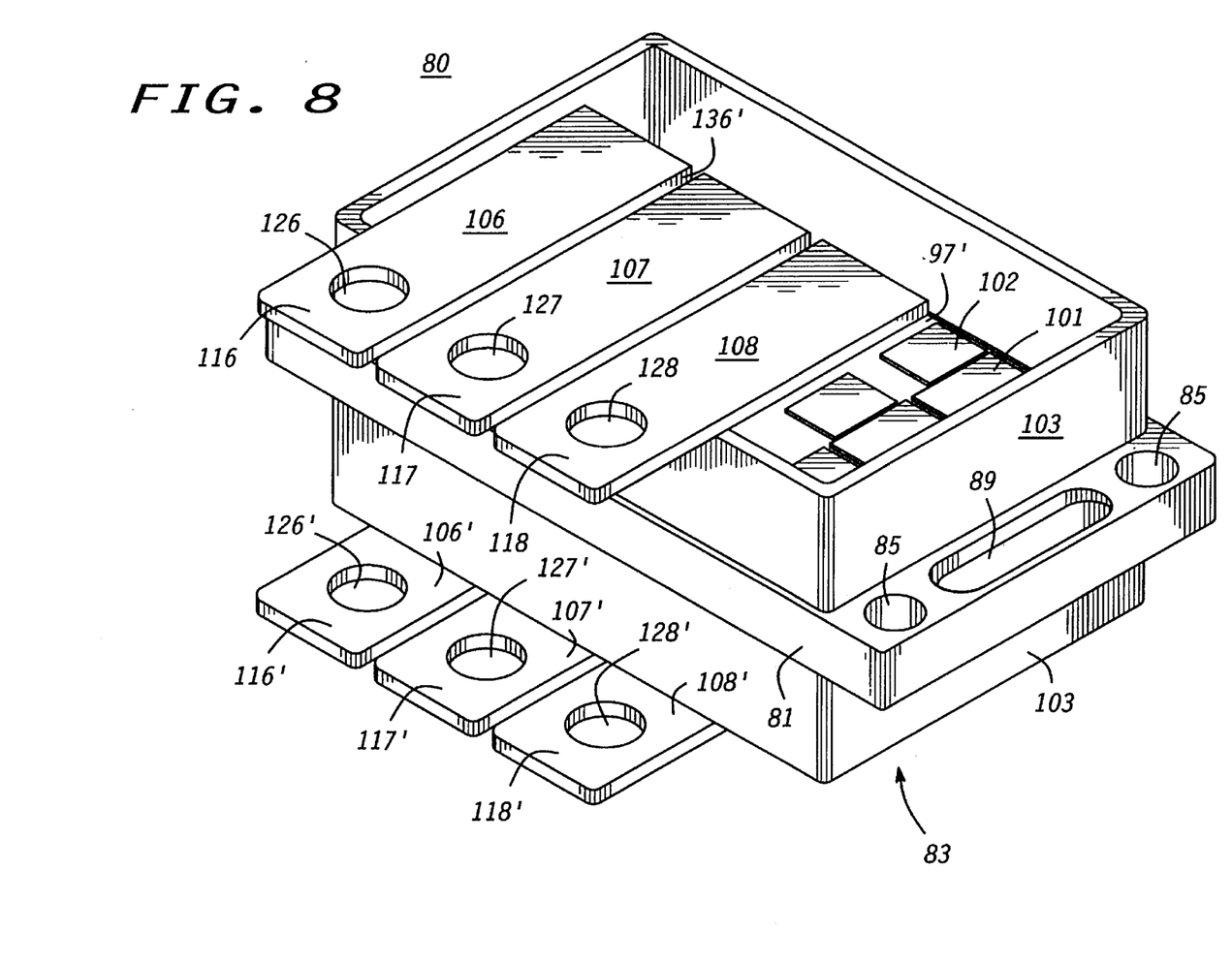
FIG. 8 illustrates an isometric view of the electronic module of FIG. 7.

FIG. 6 further illustrates an isolation structure 4 disposed on top side 82. Isolation structure 94 comprises a dielectric layer 96 having die-support conductive strips 97 and 97', a common conductive strip 98, and interconnect conductive strips 99 disposed on a first side and having a conductive layer disposed on a second side (reference numeral 92 of FIG. 8). It should be noted that conductive strips 97, 97', 98, and 99 are electrically isolated from each other. By way of example, conductive strips 97, 97', 98, and 99 are copper strips formed by bonding a sheet of copper to insulating layer 96. The sheet of copper is patterned to form die-support conductive strips 97 and 97', common conductive strip 98, and interconnect conductive strips 99. Semiconductor die 101 and 102 are mounted to die-support conductive strips 97 and 97', and the isolation structure is mounted to top side 82 by coupling a layer of conductive material 92 to top side 82. Although two types of semiconductor die are shown in FIG. 6, it should be understood that the types, sizes, and the number of semiconductor die are not limitations of the present invention. In other words, the semiconductor die may be silicon die, gallium arsenide die, die containing bipolar integrated devices, field effect transistors, rectifying devices, combinations thereof, or the like. The semiconductor die are coupled to each other or to the conductive strips by conductive interconnects or jumpers 105. It should be understood that the choice of which semiconductor die are coupled to which conductive strip is contingent upon the particular design and configuration, i.e., the choice is a design choice. Techniques for bonding copper to an insulating substrate, patterning the copper, and bonding semiconductor die to the copper are well known to those skilled in the art. It should be further understood that an isolation structure 94 having semiconductor die mounted thereon is also mounted to bottom side 83 as shown in FIG. 8.

Figure 7:
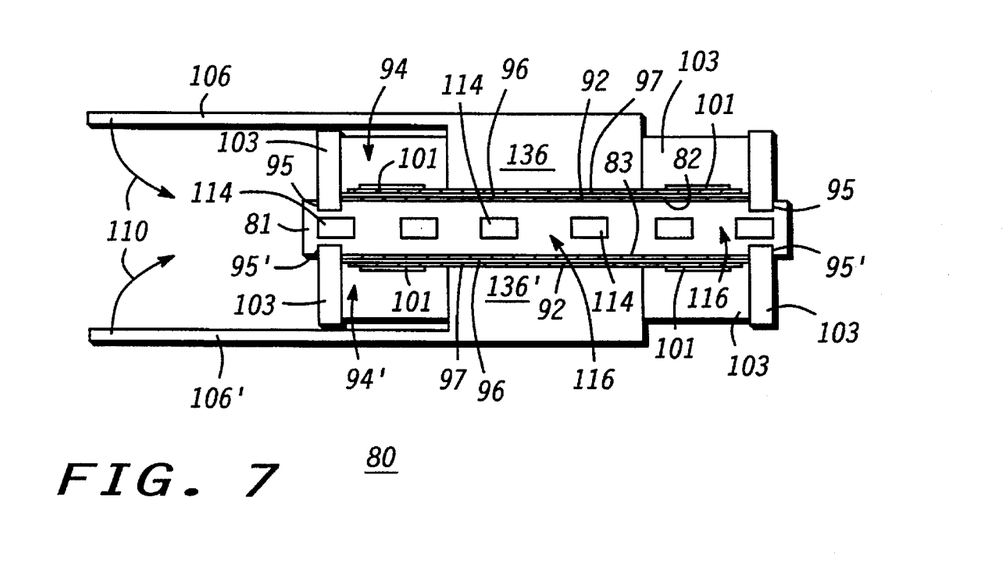
FIG. 7 illustrates a cross-sectional view of the electronic module of FIG. 6 further along in processing.

FIG. 7 illustrates a cross-sectional view of electronic module 80 which further illustrates the feature of electronic components on two sides of baseplate 81. What is shown in FIG. 7 is baseplate 81 having top and bottom surfaces 82 and 83, respectively. Heat sink 81 includes a cavity 114 between top surface 82 and bottom surface 83. In addition, fins 116 extend from top surface 82 through cavity 114, to bottom surface 83, thereby coupling surfaces 82 and 83. Top surface 82 includes a groove 95 with which retaining wall 103 is mated. Likewise, bottom surface 83 has a groove 95' mated with another retaining wall 103.

FIG. 7 further illustrates a first isolation structure 94 mounted to top surface 82 and a second isolation structure 94' mounted to bottom surface 83. It should be noted that a prime has been added to reference numeral 94 solely to distinguish the isolation structure bonded to top surface 82 from the isolation structure bonded to bottom surface 83. Further, it should be noted that in the embodiment described in FIG. 6, the isolation structures are identical; however, it should be understood that this is not a limitation of the present invention and the isolation structures bonded to top and bottom surfaces 82 and 83, respectively, may be different. Isolation structures 94 and 94' comprise a layer of dielectric material 96 sandwiched between a layer of conductive material 92 and die-support conductive strip 97. A layer of conductive material 92 of the first isolation structure 94 is bonded to top surface 82; further die-support conductive strip 97 is bonded to the insulating layer 96 of the first isolation structure. Likewise, a layer of conductive material 92 of the second isolation structure 94' is bonded to bottom surface 83 and die-support conductive strip 97 is bonded to the insulating layer 96 of the second isolation structure 94'.

In addition, FIG. 7 illustrates semiconductor die 101 bonded to die-support conductive strip 97 on first and second sides 82 and 83, respectively. Further, conductive leads 106 and 106' are shown bonded to die-support conductive strips 97 of isolation structures 94 and 94', respectively. In particular, internal interconnect portions 136 and 136' are shown bonded to die-support conductive strips 97 of isolation structures 94 and 94'. Conductive leads 106 and 106' are coupled together by bending leads 106 and 106' in a direction indicated by arrows 110. It should be noted that bonding conductive interconnects and semiconductor die to conductive strips, bonding conductive strips such as die-support conductive strip 97 to insulating layers, and bonding insulating layers to surfaces such as top surface 82 were discussed with reference to FIG. 6.

FIG. 8 illustrates an isometric view of electronic module 80 having a retaining wall 103 mounted to baseplate 81. A portion of retaining wall 103 is inserted into groove 95 and a portion of another retaining wall 103 is inserted into groove 95'. Grooves 95 and 95' are illustrated in FIG. 7. Preferably, retaining wall 103 is made of plastic and serves to contain encapsulating material or mold compound (not shown) before and after it is cured. Although electronic module 80 shown as being unencapsulated, it should be understood that preferably electronic module 80 is encapsulated using, for example, epoxy, silicon gel, hard epoxy, or the like, and that methods of encapsulating semiconductor die mounted to baseplates are well known to those skilled in the art.

In addition, conductive leads 106, 107, and 108 are mounted to the die-support conductive strip 97, common conductive strip 98 (shown in FIG. 6), and die-support conductive strip 97' (shown in FIG. 6), respectively, on top side 82. Conductive leads 106', 107', and 108' are mounted to die-support strip 97 common conductive strip 98 (not shown in FIG. 8), and die-support conductive strip 97' (not shown in FIG. 8), respectively, on bottom side 83. Conductive leads 106, 106', 107, 107', 108 and 108' transmit electrical signals to and from the semiconductor die mounted to electronic module 80. Each conductive lead 106, 106', 107, 107', 108, and 108', includes an external interconnect portion 126, 126', 127, 127', 128, and 128', respectively, having a hole 126, 126', 127, 127', 128, and 128', respectively. In addition, each conductive lead 106, 106', 107, 107', 108, and 108' has an internal interconnect portion 136 which contacts and is bonded with a respective conductive strip. It should be noted that only a portion of internal interconnect portion 136 is illustrated in FIG. 8.

By now it should be appreciated that an electronic module for removing heat from a semiconductor die and a method for fabricating the electronic module have been provided. In accordance with the present invention, the electronic module includes a baseplate having a top and a bottom, wherein at least one semiconductor die is mounted to the top and at least one semiconductor die is mounted to the bottom; thereby forming a modular unit. Preferably, the baseplate is made from a metal matrix composite such as silicon carbide impregnated with aluminum. The silicon carbide-aluminum baseplate forms a metal matrix composite that is strong. Further, the dielectric material may be selected to have a coefficient of thermal expansion similar to that of the metal matrix composite, thereby reducing warping of the baseplate and subsequent delamination phenomena which tend to occur in the prior art methods.

In addition, the mounting semiconductor die on two sides of the baseplate reduces the size of the electronic module and the requirement for an external mounting plate. Other advantages of the present invention include the elimination of the need for thermal grease, a lower contact resistance, a reduced volume of cooling fluid, and more efficient cooling and increased power density of the package.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the electronic module may be formed by coating both sides of the metal matrix composite baseplate with an epoxy. In an alternative embodiment, a direct bonded copper isolation structure may be attached to a first side of the baseplate and an epoxy applied to a second side of the baseplate, wherein copper is plated to the epoxy. In yet another embodiment, a layer of dielectric material may be attached to both sides of the baseplate during formation of the baseplate and a direct bonded copper isolation structure having copper on a single side may be brazed to the each of the layers of dielectric material.

We claim:

1. An electronic module for removing heat from a semiconductor die, comprising:

a base structure having a top surface, a bottom surface, a first side, a second side, and a cavity, wherein the cavity is between the top surface and the bottom surface, and the first side is opposite the second side, wherein the base structure comprises a metal matrix composite;

a first isolation structure disposed on a first portion of the top surface: and a second isolation structure disposed on a second portion of the bottom surface.

2. An electronic module for removing heat from a semiconductor die, comprising:
- a base structure having a top surface, a bottom surface, a first side, a second side, and a cavity, wherein the cavity is between the top surface and the bottom surface, and the first side is opposite the second side;
- a first isolation structure disposed on a first portion of the top surface, wherein the first isolation structure comprises a first layer of conductive material having a first layer of dielectric material disposed thereon, the first layer of conductive material in contact with the top surface; and
- a second isolation structure disposed on a second portion of the bottom surface, wherein the second isolation structure comprises a second layer of conductive material having a second layer of dielectric material disposed thereon, the second layer of conductive material in contact with the bottom surface.

3. The electronic module of claim 2, wherein a portion of the first layer of conductive material is coupled to a portion of the second layer of conductive material by a first conductive strap.

4. The electronic module of claim 3, wherein the first layer of conductive material, the second layer of conductive material, and the first conductive strap are a unitary structure.

5. The electronic module of claim 3, wherein a strip of dielectric material is disposed on a portion of the first conductive strap.

6. The electronic module of claim 5, wherein the first isolation structure further comprises a first strip of conductive material, the first strip of conductive material disposed on a first portion of the first layer of dielectric material and the second isolation structure further comprises a second strip of conductive material, the second strip of conductive material disposed on a first portion of the second layer of dielectric material.

7. The electronic module of claim 6, wherein a portion of the first strip of conductive material is coupled, on the first side of the base structure, to a portion of the second strip of conductive material by a second conductive strap.

8. The electronic module of claim 7, wherein an electrical lead extends from the second conductive strap.

9. An electronic module for removing heat from a semiconductor die, comprising:
- a base structure having a top surface, a bottom surface, a first side, a second side, and a cavity, wherein the cavity is between the top surface and the bottom surface, and the first side is opposite the second side:
- a first isolation structure disposed on a first portion of the top surface;
- a second isolation structure disposed on a second portion of the bottom surface;
- a third isolation structure disposed on a second portion of the top surface, the third isolation structure comprising a third layer of conductive material having a third layer of dielectric material disposed thereon; and
- a fourth isolation structure disposed on a fourth portion of the bottom surface, the fourth isolation structure comprising a fourth layer of conductive material having a fourth layer of dielectric material disposed thereon, and wherein the third layer of conductive material is in contact with the top surface and the fourth layer of conductive material is in contact with the bottom surface.

10. The electronic module of claim 9, wherein a portion of the third layer of conductive material is coupled to a portion of the fourth layer of conductive material by a third conductive strap.

11. The electronic module of claim 10, wherein the third isolation structure further comprises a third strip of conductive material, the third strip of conductive material disposed on a third portion of the third layer of dielectric material and the fourth isolation structure further comprises a fourth strip of conductive material, the fourth strip of conductive material disposed on a fourth portion of the fourth layer of dielectric material.

12. The electronic module of claim 11, wherein the third strip of conductive material is coupled to the fourth strip of conductive material by a fourth conductive strip.

13. An electronic module for removing heat from an integrated device comprising a modular unit, the modular unit comprising;
- a hollow unitary structure having a top, a bottom, a first side, a second side, the top having a plurality of ports;
- a first support structure adjacent a first portion of the top, wherein the first support structure is U-shaped having a first pair of legs coupled by a first bend and comprising a first dielectric layer disposed on a first conductive layer, the first bend being adjacent the first side of the hollow unitary structure and the first pair of legs straddling the hollow unitary structure;
- a first integrated device mounted to the first support structure:
- a second support structure adjacent a first portion of the bottom, wherein the second support structure is U-shaped having a second pair of legs coupled by a second bend and comprising a second dielectric layer disposed on a second conductive layer, the second pair of legs straddling the hollow unitary structure; and
- a second integrated device mounted to the second support structure.

14. The electronic module of claim 13, wherein the first support structure further comprises a third conductive layer, the third conductive layer disposed on the first dielectric layer and the second support structure further comprises a fourth conductive layer, the fourth conductive layer disposed on the second dielectric layer, 15. The electronic module of claim 13, wherein the second bend is adjacent the second side.

* * * * *